United States Patent [19]

Pathak et al.

[11] Patent Number: 5,493,244

[45] Date of Patent: Feb. 20, 1996

[54] BREAKDOWN PROTECTION CIRCUIT USING HIGH VOLTAGE DETECTION

[75] Inventors: Saroj Pathak, Los Altos Hills; James E. Payne, Boulder Creek; Glen A. Rosendale, Santa Clara, all of Calif.

[73] Assignee: Atmel Corporation, San Jose, Calif.

[21] Appl. No.: 180,689

[22] Filed: Jan. 13, 1994

[51] Int. Cl.⁶ .................................................. H03K 5/08
[52] U.S. Cl. ........................ 327/313; 327/333; 327/437
[58] Field of Search ................................. 326/62, 63, 83, 326/87, 121, 122; 327/427, 434, 436, 437, 530, 538, 543, 545, 546, 108, 313, 333

[56] References Cited

U.S. PATENT DOCUMENTS

| | | | |
|---|---|---|---|
| 4,161,663 | 7/1979 | Martinez | 307/264 |
| 4,689,504 | 8/1987 | Raghunathan et al. | 307/449 |
| 4,845,381 | 7/1989 | Cuevas | 307/264 |
| 4,956,569 | 9/1990 | Olivo et al. | 307/443 |
| 4,988,894 | 6/1991 | Takiba et al. | 327/437 |
| 5,029,283 | 7/1991 | Ellsworth et al. | 326/44 |
| 5,054,001 | 10/1991 | Guillot | 365/226 |
| 5,128,560 | 7/1992 | Chern et al. | 327/530 |
| 5,136,190 | 8/1992 | Chern et al. | 307/475 |
| 5,157,280 | 10/1992 | Schreck et al. | 327/436 |
| 5,208,488 | 5/1993 | Takiba et al. | 327/546 |
| 5,274,276 | 12/1993 | Casper et al. | 327/537 |
| 5,278,460 | 1/1994 | Casper | 327/546 |
| 5,296,757 | 3/1994 | Koizumi | 327/530 |
| 5,336,952 | 8/1994 | Iwahashi et al. | 327/427 |
| 5,341,045 | 8/1994 | Almulla | 326/62 |
| 5,369,317 | 11/1994 | Casper et al. | 326/87 |

*Primary Examiner*—Terry Cunningham
*Attorney, Agent, or Firm*—Schneck & McHugh

[57] ABSTRACT

A high voltage circuit includes a first switching device for supplying one of a high voltage ($V_{pp}$) and a low voltage ($V_{cc}$) to a controlled path that includes a series connection of a control p-channel transistor and a protection p-channel transistor. A high voltage detector is utilized to determine whether $V_{pp}$ or $V_{cc}$ is applied to the controlled path. The high voltage detector also establishes a protecting condition for the protection p-channel transistor during $V_{pp}$ operation. On the other hand, the detector establishes a non-protecting condition during $V_{cc}$ operation, thereby rendering the protecting p-channel transistor transparent to circuit performance. A signal input switches the control p-channel transistor between on and off states. When the control transistor is in an off state and the protection transistor is in a protecting condition, the voltage drop along the controlled path will cause the protection transistor to turn off, so as to limit the voltage across the control transistor. A second controlled path is preferably in series connection with the first controlled path. The second controlled path includes n-channel transistors, with one of the transistors fixed at $V_{cc}$ in order to guard against gate-aided junction breakdown of the other transistor. In this embodiment, the high voltage circuit is preferably an inverter circuit.

17 Claims, 2 Drawing Sheets

BREAKDOWN PROTECTION CIRCUIT USING HIGH VOLTAGE DETECTION

TECHNICAL FIELD

The present invention relates generally to high voltage circuits and more particularly to breakdown-protected circuits operable at high speeds and high voltages.

BACKGROUND ART

In the fabrication of integrated circuits using metal oxide semiconductor (MOS) techniques, gate oxide layers are becoming increasingly thinner in order to achieve further increases in transistor performance. For a given set of terminal voltages, the drain current of an MOS transistor is inversely proportional to the thickness of the gate oxide. A "thin gate transistor" may have a gate oxide layer which is less than 300 Å thick. Decreasing the length of transistor channels also enhances the performance of an integrated circuitry.

A decrease in the thickness of the gates of an integrated circuit renders the circuit more susceptible to gate-aided junction breakdown. Gate-aided junction breakdown will cause incorrect voltage levels in a logic circuit, high power dissipation, and possibly irreversible damage to the affected transistors.

Many non-volatile devices, including EPROMs, EEPROMs, PLDs and FPGAs, require operation at high voltages without breakdown. For example, a high voltage may be used in a write or erase operation. Circuits which include protection against breakdown at high voltages are known. Such circuits are described in U.S. Pat. Nos. 4,161,663 to Martinez, 4,689,504 to Raghunathan et al., 4,845,381 to Cuevas, and 5,054,001 to Guillot. While prior art circuits work well as designed, there are certain disadvantages. For example, some circuits require not only the conventional supply voltage ($V_{cc}$) and the high operating voltage ($V_{pp}$), but also require an intermediate voltage ($V_1$ and $V_2$). Another disadvantage is that some of the known circuits are limited to switching between $V_{pp}$ and ground at an output node or switching between $V_{pp}$ and $V_{cc}$ at the output node. Circuits that allow selecting between $V_{pp}$ and ground or between $V_{cc}$ and ground are typically complex. The complexity often reduces the speed of the circuit.

It is an object of the present invention to provide a high voltage circuit that permits use of high speed, thin gate transistors without rendering the circuit susceptible to gate-aided junction breakdown and without complexity.

SUMMARY OF THE INVENTION

The above object has been met by a circuit which utilizes a high voltage detector firstly to determine whether an input node to a controlled path is at a high positive supply voltage ($V_{pp}$) or a low positive supply voltage ($V_{cc}$) and secondly to establish a breakdown-protection mode based upon the determination. The controlled path includes a control MOS transistor and a protection MOS transistor connected in series. In the breakdown-protection mode, the protection MOS transistor limits the voltage across the control MOS transistor. In a non-protecting mode, the protection MOS transistor remains transparent to circuit operation.

The high voltage detector is connected to monitor the voltage to the controlled path. The monitoring may be directly at the input node to the controlled path. Alternatively, the monitoring may be indirect, such as by sensing when a high voltage supply is in electrical communication with the input node. If the input node is at $V_{pp}$, the high voltage detector biases a gate of the protection MOS transistor such that the switching of the control MOS transistor to an "off" state will cause the protection MOS transistor to turn off. As a result, the voltage drop across the control MOS transistor will be reduced by the difference of the gate voltage and the threshold voltage of the protection MOS transistor. In a preferred embodiment, the gate voltage is equal to $V_{cc}$, so that there is no need to generate intermediate voltages. If $V_{cc}$ is equal to 5 volts and the threshold voltage is −1 volt, the voltage across the control MOS transistor will be reduced by 6 volts, rendering the transistor less likely to undergo gate-aided junction breakdown.

If the input node to the controlled path is at $V_{cc}$, breakdown protection is not necessary. The high voltage detector then establishes a gate voltage at the protection MOS transistor to keep the transistor in an "on" state regardless of the state of the control MOS transistor. For example, if both of the transistors in the controlled path are p-channel transistors, the gate voltage may be set at 0, ensuring a non-protecting condition that renders the protection MOS transistor transparent to circuit operation.

The gate voltage of the control MOS transistor is determined by an input signal. Where both of the transistors in the controlled path are p-channel transistors, a high voltage signal generator receives an input signal and switches the gate voltage between $V_{pp}$ and ground. The controlled path leads to a circuit output and to a second controlled path having a second protection MOS transistor and a second control MOS transistor. The second control MOS transistor is tied to ground potential at a source and has a gate that is connected to the gate of the above-described control MOS transistor. Thus, the gate voltage is dictated by the input signal, but where one control MOS transistor is an n-channel device and the other is a p-channel device, the on/off state of one of the two control transistors will be the inverse of the other. The drain of the second control MOS transistor is connected to the source of the second protection MOS transistor. When the two transistors of the second controlled path are n-channel transistors, the gate voltage of the second protection MOS transistor can be fixed at $V_{cc}$. At this gate voltage, the transistor is transparent to operation of the transistors at $V_{cc}$, but limits the voltage across the second control MOS transistor when $V_{pp}$ is applied to the controlled paths.

While not critical, the circuit may be an inverter, wherein an input signal switches the output between either $V_{pp}$ and ground potential or $V_{cc}$ and ground potential, depending upon the voltage supplied to the input node of the controlled paths.

An advantage of the present invention is that the two protection MOS transistors allow the circuit to be formed using thin gate transistors without jeopardizing the circuit to gate-aided junction breakdown. Yet, the protection MOS transistors have no effect on operation in the $V_{cc}$ mode and add minimal complexity even in the $V_{pp}$ mode. The high voltage detector ensures transparency of the protection circuit during $V_{cc}$/ground switching.

BEST MODE FOR CARRYING OUT THE INVENTION

Figure 1:
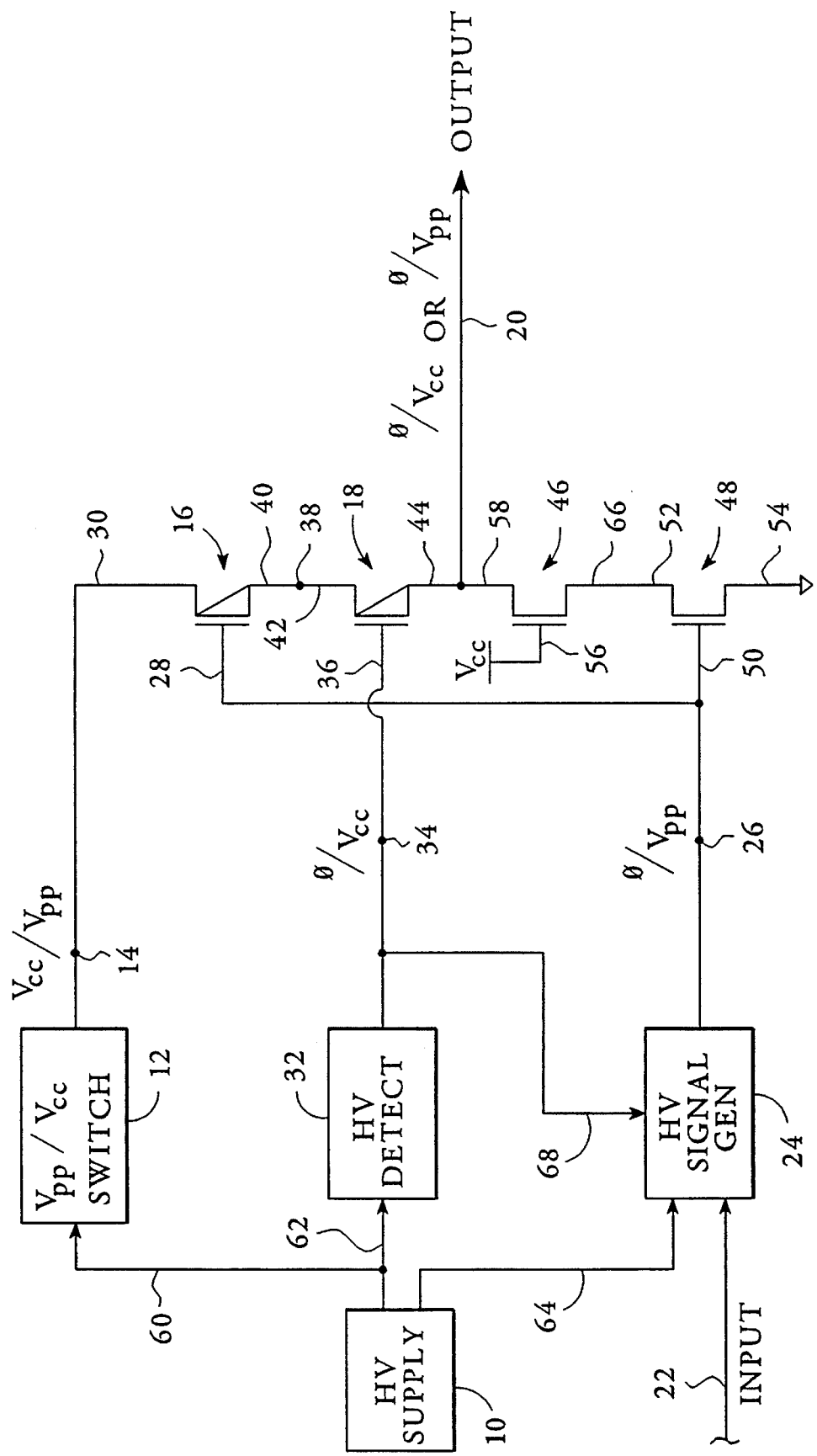
FIG. 1 is a schematic diagram of a first embodiment of an inverter having breakdown-protection transistors in accordance with the present invention.

With reference to FIG. 1, a high voltage supply 10 is shown as being connected to a $V_{pp}/V_{cc}$ switch 12 for switching between a low positive voltage ($V_{cc}$) and a high positive voltage ($V_{pp}$) at a supply node 14. The connection between the supply 10 and the $V_{pp}/V_{cc}$ may be selectively by internally grounding node 60 within the high voltage supply 10 and the $V_{pp}/V_{cc}$ may be designed to automatically provide $V_{cc}$ to the supply node 14 whenever such interruption occurs. If the supply 10 is capable of alternating between $V_{cc}$ and $V_{pp}$, the $V_{pp}/V_{cc}$ is not utilized.

The supply node 14 is an inlet to a first controlled path comprising two p-channel transistors 16 and 18. The first p-channel transistor 16 is a control MOS device, while the second p-channel transistor is designed to function as a protection MOS device. An output 20 switches between either ground potential and $V_{cc}$ or ground potential and $V_{pp}$, depending upon the voltage level at the supply node 14. An input signal is received by a high voltage signal generator 24 at a signal line 22. In the preferred embodiment, a low at the signal line 22 will result in ground potential at a gate node 26, while a high will raise the gate node to $V_{pp}$. The gate node is connected to the gate 28 of the first p-channel transistor 16. At ground potential, the gate 28 will cause the transistor to be in an "on" state, since the voltage level at the source 30 will exceed that of the gate regardless of whether $V_{cc}$ or $V_{pp}$ is at the supply node 14. A logic high at the signal line 22 will provide $V_{pp}$ at the gate 28, causing the voltage level to be at least as great as that of the source 30, thereby switching the transistor 16 to an "off" state.

A high voltage detector 32 is connected to monitor the voltage to the first p-channel transistor 16. In the circuit of FIG. 1, the monitoring is done indirectly by determining the output of the high voltage supply 10. When the voltage at the supply node 14 is determined to be $V_{cc}$, the high voltage detector establishes ground potential at a protect node 34. The protect node is connected to a gate 36 of the second p-channel transistor 18. A junction node 38 is at the connection of the drain 40 of the first transistor 16 and the source 42 of the second transistor 18. When both the first and second p-channel transistors are in an on state, the output line 20 from a drain 44 of the second transistor is at the same voltage level as the supply node 14. The two transistors will remain on as long as the gate 28 of the first transistor is at ground potential.

When the first and second p-channel transistors 16 and 18 are on, at least one of a first n-channel transistor 46 and a second n-channel transistor 48 is off. Because of the difference between the n-channel and p-channel transistors, ground potential at gate node 26 switches the p-channel transistor 16 on and switches the n-channel transistor 48 off. The inverse is also true. That is, when the first p-channel transistor 16 is switched off by $V_{pp}$ at the gate 28, the second n-channel transistor 48 is turned on. $V_{pp}$ at the gate 50 establishes a path from the drain 52 to the source 54 of the transistor 48. The gate 56 of the first n-channel transistor 46 is fixed at $V_{cc}$, thereby establishing a condition in which the transistor 46 will remain on as long as the voltage at the source 58 does not exceed the voltage at the gate 56.

In operation, there are four possible combinations of voltage levels for determining the on/off states of the p-channel transistors 16 and 18 and the n-channel transistors 46 and 48. In the first of these combinations, the high voltage supply 10 applies a potential along line 60 to the $V_{pp}/V_{cc}$ 12 such that $V_{cc}$ is at the supply node 14. The high voltage detector 32 is connected to the supply 10 by means of line 62. A low voltage or no voltage setting of the supply 10 results in the detector providing ground potential at the protect node 34. The high voltage signal generator 24 switches between ground and $V_{pp}$ depending upon the input at the signal line 22. $V_{pp}$ is obtained by connection to the high voltage supply 10 via line 64 making the $V_{pp}$ connection to the high voltage signal generator 24 independent of the voltage on line 60. With the supply node 14 at $V_{cc}$ and the gate node 26 at ground, the first p-channel transistor 16 will be in an on state and the second n-channel transistor 48 will be in an off state. Both of the p-channel transistors 16 and 18 will have ground potential at the gates 28 and 36, so that the output line 20 will be at $V_{cc}$.

In a second of the four possible combinations, the supply node 14 remains at $V_{cc}$, but the input along signal line 22 is at logic high. The generator 24 then provides $V_{pp}$ at the gate node 26, causing the first p-channel transistor 16 to turn off and the second n-channel transistor 48 to turn on. The controlled path from the output line 20 to ground at the source 54 of the second n-channel transistor pulls the output line to ground. Consequently, the circuit of FIG. 1 acts as an inverter.

When the supply node 14 is at $V_{cc}$, the second p-channel transistor 18 and the first n-channel transistor 46 are transparent to circuit operation. That is, both of the transistors remain in an on state, while the first p-channel transistor 16 and the second n-channel transistor 48 are switched on and off by varying the potential at the two gates 28 and 50. The high voltage detector 32 establishes a non-protecting condition for the second p-channel transistor 18 by maintaining the gate 36 at ground.

In the third combination of supply voltage and input signal level, the high voltage supply 10 is switched to establish $V_{pp}$ at the supply node 14 and the input at signal line 22 is at a logic low. In this mode, the gate 28 of the first p-channel transistor 16 is at 0 volts and the transistor is on. In contrast, the 0 volts at the gate 50 of the second n-channel transistor 48 turns the transistor off, so that a ground path from the output line 20 is blocked. With the high voltage supply 10 at a high, the detector 32 provides $V_{cc}$ to the gate 36 of the second p-channel transistor 18. The $V_{cc}$ at the gate 36 is exceeded by the $V_{pp}$ from supply node 14, and the transistor 18 remains on to allow the output line 20 be pulled up to the level of the supply node 14, i.e. $V_{pp}$.

In the last of the four combinations, the supply remains at high voltage, but the signal line 22 is switched to a logic high. In this condition, the gate 28 of the first p-channel transistor 16 goes to $V_{pp}$, matching the level at the supply node 14. Therefore, the first p-channel transistor is switched off. Simultaneously, $V_{pp}$ at the gate 50 of the second n-channel transistor 48 turns the transistor on, establishing a ground path to the output line 20.

As described above, the logic level at the signal line 22 is inverted and causes the output line 20 to switch between either 0 volts and $V_{cc}$ or 0 volts and $V_{pp}$, depending upon the potential at the supply node 14. Each of the transistors 16, 18, 46 and 48 is a thin gate transistor, so that the inverter is able to operate at high speeds. With $V_{cc}$ at the supply node 14, the thin gate transistors are not susceptible to gate-aided junction breakdown. However, $V_{pp}$ will exceed the breakdown voltage of the transistors. The second p-channel transistor 18 and the first n-channel transistor 46 are included in the circuit to prevent damage to the other two transistors 16 and 48. When the second n-channel transistor 48 is off, the first n-channel transistor 46 will prevent the full $V_{pp}$ from reaching the first n-channel transistor. This is because as the junction of the source 66 of the first transistor 46 with the drain 52 of the second transistor 48 reaches a potential equal to the potential difference between the gate 56 and the threshold voltage of the transistors, the first transistor 46 will be turned off and no further voltage increase will reach the drain 52 of the second transistor 48. In the embodiment described above, the gate voltage 56 is at the $V_{cc}$ voltage of 5 V and the threshold voltage may be approximately 1 V, so that the voltage across the drain 52 and the source 54 of the second transistor 48 will be limited to 4 V. These voltages are not critical to the invention, however.

When the gate node 26 is brought to a level of $V_{pp}$ by a logic high at the signal line 22, the two n-channel transistors 46 and 48 will turn on. At the same time, the first p-channel transistor 16 will be switched off. The second p-channel transistor 18 will also shut off, because the level at the junction node 38 will drop to a voltage equal to the gate voltage at 36 less the threshold voltage of the p-channel transistors 16 and 18. Because the two transistors 16 and 18 are both off, the control transistor 16 does not drop the entire $V_{pp}$ level.

The high voltage detector 32 determines whether the first controlled path from the supply node 14 to the output line 20 is operable at $V_{cc}$ or $V_{pp}$. The detector then establishes a protecting condition or a non-protecting condition at the second p-channel transistor 18 according to the determination. The same protection can be achieved for thin gate MOS transistors within the high voltage signal generator 24. Line 68 is included to provide a signal to protection MOS transistors, not shown, within the circuitry of the generator 24.

Figure 2:
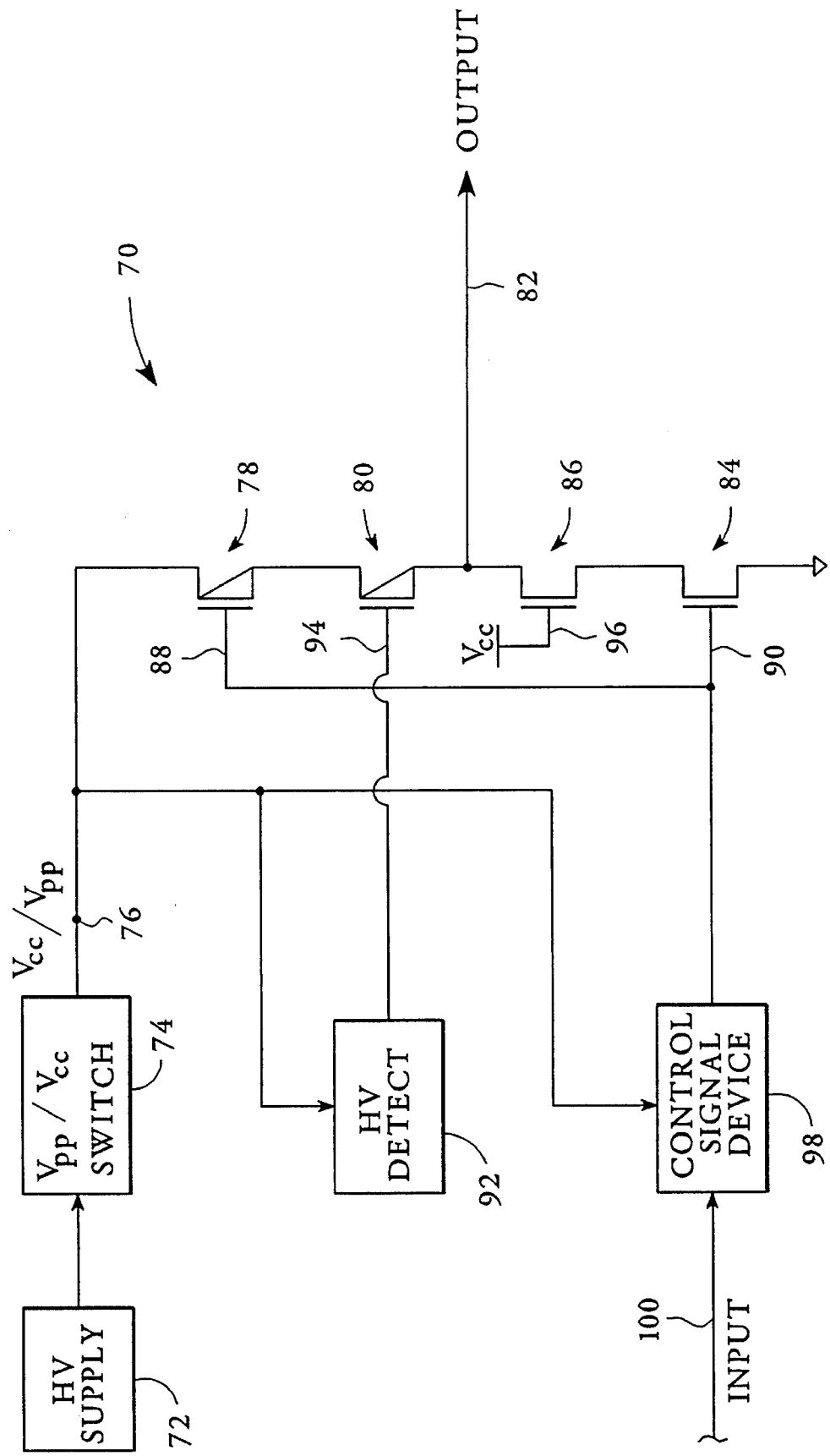
FIG. 2 is a schematic diagram of a second embodiment of an inverter having breakdown-protection transistors in accordance with the present invention.

Referring now to FIG. 2, a second inverter circuit 70 is shown as including the same elements as FIG. 1, but in a different arrangement. A high voltage supply 72 capable of internally switching between $V_{pp}$ and ground is connected to the $V_{pp}/V_{cc}$ switch 74 to provide either $V_{cc}$ or $V_{pp}$ at a supply node 76 in the same manner as the $V_{pp}/V_{cc}$ switch 12 of FIG. 1. A first controlled path for the circuit includes a control p-channel transistor 78 and a protection p-channel transistor 80. When each of the p-channel transistors is on, an output line 82 will be at the same level as the supply node 76. A second controlled path includes a control n-channel transistor 84 and a protection n-channel transistor 86. Because the gates 88 and 90 of the control transistors 78 and 84 are connected, one controlled path will be electrically opened and the other will be electrically shorted at all times that the circuit 70 receives power.

A high voltage detector 92 is connected directly to monitor the voltage level at the supply node 76. $V_{cc}$ at the supply node will cause the detector to establish a non-protecting condition in which a gate 94 of the protection p-channel transistor 80 is at ground. $V_{pp}$ at the supply node 76 will raise the level of the gate 94 to $V_{cc}$, establishing a protecting condition.

A gate 96 of the protection n-channel transistor 86 is fixed at $V_{cc}$. Thus, the protection n-channel transistor 86 remains transparent to operation of the circuit 70 in the absence of the combination of the control n-channel transistor 84 being turned off and a high voltage at the output line 82. The gates 88 and 90 of the control transistors 78 and 84 are each connected to a control signal device 98. The device may work in the same manner as the signal generator of FIG. 1, but this is not critical. The device receives an input from the $V_{pp}/V_{cc}$ switch 74. Optionally, the level at an input line 100 may connect and disconnect the gates 88 and 90 to the supply node 76. Thus, in $V_{cc}$ operation, the gates 88 and 90 will be switched between $V_{cc}$ and ground by a change of the logic level at the signal line 100. In $V_{pp}$ operation, the logic level at signal input line 100 will determine whether the gates 88 and 90 are at ground potential or at $V_{pp}$.

The transistors 78, 80, 84 and 86 operate in the same manner as described with reference to FIG. 1. If the control p-channel transistor 78 is off and the supply node 76 is at $V_{pp}$, the protection p-channel transistor 80 will turn off, preventing the control p-channel transistor from having the full voltage across it. The junction of the two p-channel transistors will not go below the gate voltage at 94 minus the threshold voltage of the transistor. In like manner, the protection n-channel transistor 86 limits the voltage across the control n-channel transistor 84.

While the use of a high voltage detector to establish protecting and non-protecting conditions for a protection transistor has been described and illustrated as being used with a p-channel transistor in an inverter circuit, this is not critical. The combination of a control transistor and a protection transistor and a high voltage detector may be utilized in other circuits as well.

We claim:

1. A high voltage circuit comprising:

voltage input means for switching between a first supply voltage of greater magnitude than ground potential and a second supply voltage, said second supply voltage being of greater magnitude than said first supply voltage;

a controlled path coupled between said voltage input means and an output node, said controlled path including a control MOS transistor and a protection MOS transistor connected in series, said control and protection MOS transistors each having a gate electrode;

signal input means connected to said gate of said control MOS transistor for switching said control MOS transistor between an on state and an off state; and high voltage detection means with a binary output for determining an output potential of said voltage input means and establishing a protecting condition for said protection MOS transistor when the output potential is at said second positive supply voltage and establishing a non-protecting condition for said protection MOS transistor when the output potential is at said first positive supply voltage, said protecting condition being one in which a gate voltage is applied to said gate electrode of said protection MOS transistor such that the voltage across said control MOS transistor in an off state is maintained substantially at said second supply voltage decreased by the difference of the gate voltage and threshold voltage of said protection MOS transistor, said non-protecting condition being one in which the voltage across said control MOS transistor in an off state is maintained substantially at said first supply voltage decreased by at most the threshold voltage of said protection MOS transistor.

2. The circuit of claim 1 wherein said control MOS transistor has said source electrode connected to said voltage input means and has said drain electrode connected to the source electrode of said protection MOS transistor, said drain electrode of said protection MOS transistor being connected to said output node.

3. The circuit of claim 1 wherein said high voltage detection means is connected to a voltage source of said second positive supply voltage to monitor said voltage source.

4. The circuit of claim 1 further comprising a second controlled path from said output node to ground potential, said second controlled path including a second protection MOS transistor and a second control MOS transistor connected in series, said second control MOS transistor having a gate electrode coupled to said signal input means to switch to an on/off state opposite to an on/off state of said control MOS transistor of said first controlled path, said second protection MOS transistor having a gate electrode connected to a fixed voltage source to establish a protecting condition in which the voltage across said second control MOS transistor in an off state is maintained at said fixed voltage less a threshold voltage of said second protection MOS transistor.

5. The circuit of claim 1 wherein said control and protection MOS transistors are p-channel transistors, said high voltage detection means setting said gate electrode of said protection MOS transistor at said first positive supply voltage when said supply node is at said second positive supply voltage, thereby establishing said protecting condition.

6. The circuit of claim 1 wherein each of said control and protection MOS transistors has a breakdown voltage between said first positive supply voltage and said second positive supply voltage.

7. The circuit of claim 1 wherein said signal input means includes a high voltage signal generator connected to receive a control signal and to boost the voltage level of a positive cycle of said control signal up to a value substantially equal to said second positive supply voltage.

8. A high voltage circuit comprising:

first switching means for supplying one of a high voltage ($V_{pp}$) and a low voltage ($V_{cc}$) greater than ground potential;

a first p-channel transistor having a drain and a gate and having a source connected to said first switching means;

a second p-channel transistor having a drain and a gate and having a source connected to said drain of said first p-channel transistor;

control signal means for selectively switching said gate of said first p-channel transistor between a positive voltage and ground potential to turn said first p-channel transistor off and on, respectively;

second switching means responsive to said first switching means and connected to said gate of said second p-channel transistor for applying $V_{cc}$ when said first switching means supplies $V_{pp}$ and for applying ground potential when said first switching means supplies $V_{cc}$.

9. The circuit of claim 8 wherein said second switching means includes a high voltage detector connected to monitor a source of high voltage to said first switching means.

10. The circuit of claim 8 further comprising first and second n-channel transistors and an output node, said output node being at said drain of said second p-channel transistor, said first and second n-channel transistors being connected in series to form a path from said output node to ground potential, said first n-channel transistor having a gate connected to be fixed at $V_{cc}$, said second n-channel transistor being connected to said control signal means.

11. The circuit of claim 10 wherein said gate of said first p-channel transistor is connected to said gate of said second n-channel transistor.

12. The circuit of claim 10 wherein the positive voltage generated by said control signal means has a value equal to $V_{pp}$.

13. The circuit of claim 8 wherein said control signal means includes a signal input and a generator for boosting a positive potential level of a signal at said signal input, said boosted potential level having a value equal to $V_{pp}$.

14. The circuit of claim 8 wherein said first and second p-channel transistors are thin gate MOS transistors.

15. A high voltage inverter circuit comprising:

a signal input;

a signal output to be switched between 0 volts and a positive voltage level ($V_{cc}$) and between 0 volts and a boosted positive voltage level ($V_{pp}$) in response to said signal input;

voltage supply means having a first node for selectively switching the potential at said first node between $V_{cc}$ and $V_{pp}$;

a first controlled path coupled between said first node and said signal output, said first controlled path including first and second p-channel transistors connected in series, with a source of said first p-channel transistor connected to said voltage supply means and with a drain of said second p-channel transistor connected to said signal output, each of said first and second p-channel transistors having a gate;

detection means coupled to said voltage supply means for supplying ground potential to said gate of said second p-channel transistor when said first node is at $V_{cc}$ and supplying $V_{cc}$ to said gate of said second p-channel transistor when said first node is at $V_{pp}$;

a second controlled path from said signal output to ground potential, said second controlled path including first and second n-channel transistors connected in series, with a drain of said first n-channel transistor connected to said signal output and with a source of said second n-channel transistor connected to ground potential, said first n-channel transistor having a gate connected to receive a fixed $V_{cc}$; and switching means having an input connected to said signal input and having an output connected to gates of said first p-channel and second n-channel transistors for supplying a positive voltage to said gates when said signal input is at a logic high and for supplying ground potential when said signal input is at a logic low, said positive voltage being sufficient to turn said first p-channel transistor to an off state;

wherein when said first node is at $V_{pp}$ and said switching means supplies said positive voltage to said gate, the voltage at the drain of said first p-channel transistor is maintained substantially at the voltage of the gate of said second p-channel transistor minus the threshold voltage of said second p-channel transistor.

16. The circuit of claim 15 wherein said switching means is connected to provide said positive voltage at a potential substantially equal to $V_{pp}$.

17. The circuit of claim 15 wherein said first and second n-channel and p-channel transistors are thin gate MOS transistors.

* * * * *

UNITED STATES PATENT AND TRADEMARK OFFICE
CERTIFICATE OF CORRECTION

PATENT NO. : 5,493,244
DATED : February 20, 1996
INVENTOR(S) : Saroj Pathak et al.

It is certified that error appears in the above-indentified patent and that said Letters Patent is hereby corrected as shown below:

Column 3, line 11, after $V_{pp}/V_{cc}$, insert - - switch - -.

Column 3, line 11, after "may be selectively", insert - - interrupted - -.

Column 3, line 13, after $V_{pp}/V_{cc}$, insert - - switch - -.

Column 3, line 16, after $V_{pp}/V_{cc}$, insert - - switch - -.

Column 4, line 3, after $V_{pp}/V_{cc}$, insert - - switch - -.

Column 4, line 51, after "the supply", insert - - 10 - -.

Signed and Sealed this

Second Day of July, 1996

Attest:

BRUCE LEHMAN

*Attesting Officer*     Commissioner of Patents and Trademarks